United States Patent
Madore

(10) Patent No.: US 7,283,859 B2
(45) Date of Patent: Oct. 16, 2007

(54) ARTIFACT SUPPRESSION IN DYNAMIC MAGNETIC RESONANCE IMAGING

(75) Inventor: Bruno Madore, Brookline, MA (US)

(73) Assignee: Brigham and Womens' Hospital, Inc., Boston, MA (US)

( * ) Notice: Subject to any disclaimer, the term of this patent is extended or adjusted under 35 U.S.C. 154(b) by 1042 days.

(21) Appl. No.: 10/125,983

(22) Filed: Apr. 19, 2002

(65) Prior Publication Data

US 2002/0156364 A1    Oct. 24, 2002

Related U.S. Application Data

(60) Provisional application No. 60/285,422, filed on Apr. 20, 2001.

(51) Int. Cl.
*A61B 5/05* (2006.01)

(52) U.S. Cl. ...................................................... 600/410

(58) Field of Classification Search ........ 600/410–424; 324/307, 309, 322

See application file for complete search history.

(56) References Cited

U.S. PATENT DOCUMENTS

| | | | | |
|---|---|---|---|---|
| 5,001,429 A * | 3/1991 | Constable et al. | ........... | 324/312 |
| 5,309,101 A * | 5/1994 | Kim et al. | .................. | 324/309 |
| 5,345,173 A * | 9/1994 | Bito et al. | ................... | 324/309 |
| 5,672,969 A | 9/1997 | Zhou et al. | .................. | 324/309 |
| 5,729,140 A | 3/1998 | Kruger et al. | ............... | 324/309 |
| 5,785,042 A | 7/1998 | Kao | .......................... | 128/653.2 |
| 5,910,728 A * | 6/1999 | Sodickson | .................... | 324/309 |
| 5,933,006 A * | 8/1999 | Rasche et al. | ............... | 324/307 |
| 5,987,347 A | 11/1999 | Khoury et al. | ............... | 600/410 |
| 6,100,689 A * | 8/2000 | Huff et al. | .................... | 324/309 |
| 6,114,852 A * | 9/2000 | Zhou et al. | .................. | 324/306 |
| 6,198,283 B1 * | 3/2001 | Foo et al. | ..................... | 324/309 |
| 6,448,771 B1 * | 9/2002 | Harvey et al. | ............... | 324/307 |
| 6,512,372 B1 * | 1/2003 | Ikezaki | ........................ | 324/312 |
| 6,556,009 B2 * | 4/2003 | Kellman et al. | ............. | 324/309 |

OTHER PUBLICATIONS

Notification of Transmittal of The International Search Report or the Declaration, mailed Apr. 15, 2003.

* cited by examiner

*Primary Examiner*—Francis J. Jaworski
(74) *Attorney, Agent, or Firm*—Mintz Levin Cohn Ferris Glovsky and Popeo, P.C.

(57) ABSTRACT

A method for removing one or more artifacts from a time series of magnetic resonance (MR) images is provided. In one embodiment of the invention, an MR time series of data sets is acquired while changing the k-space that is sampled at each time frame. By using the acquired data, information is produced for a plurality of MR images at different time points, wherein the images contain desired components and one or more artifacts. Changing the k-space locations that are sampled from time frame to time frame makes the artifacts behave in a signature way through time, so that they can be identified as being artifacts and be removed through temporal analysis.

39 Claims, 7 Drawing Sheets

FIG. 1
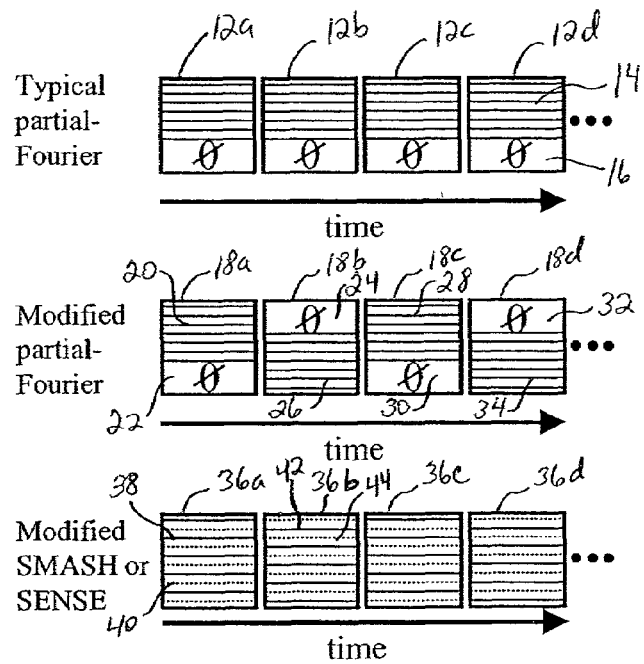
FIG. 2
FIG. 3A
FIG. 3B
FIG. 4A  FIG. 4B  FIG. 4C
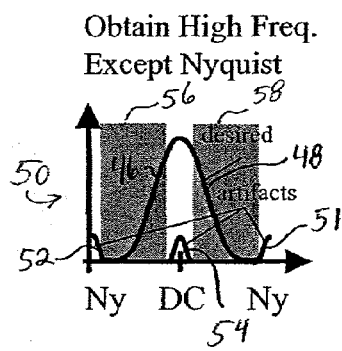
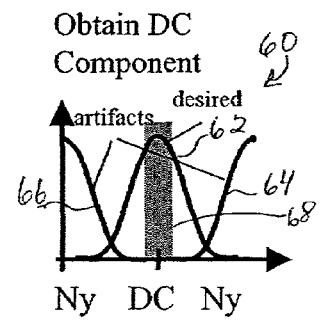
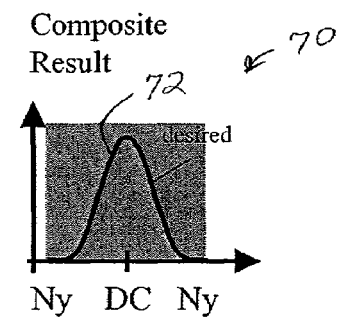

FIG. 5A
Remove Above Nyquist
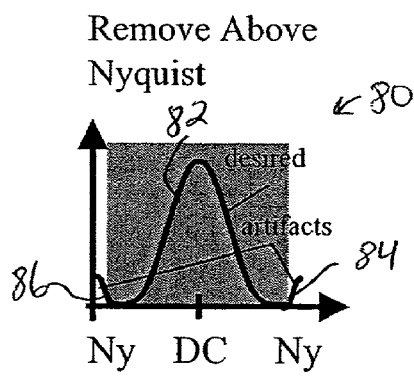
Ny  DC  Ny
FIG. 5B
Result
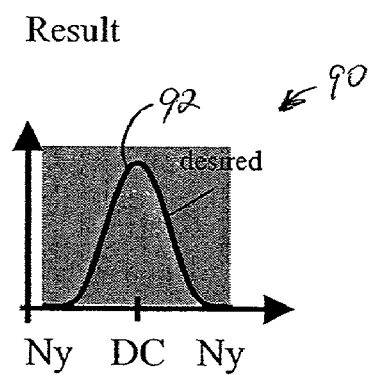
Ny  DC  Ny
Partial Fourier, 55% of lines (141 of 256), imaginary part shown
WITHOUT FILTERING
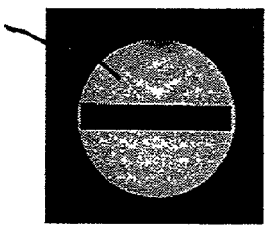
FIG. 6A
WITH FILTERING
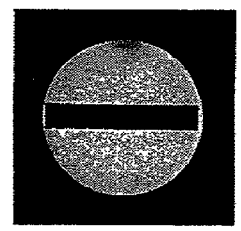
FIG. 6B
Original SMASH, 50% of lines (128 of 256), simulated data
(artifact)
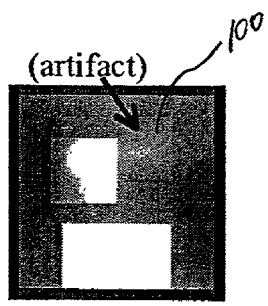
FIG. 7A
(no artifact)
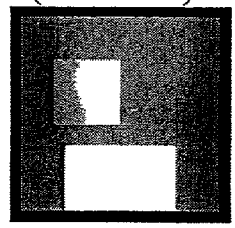
FIG. 7B WITHOUT FILTERING    WITH FILTERING
SENSE,
33% of lines (32 of
96), *in vivo* data
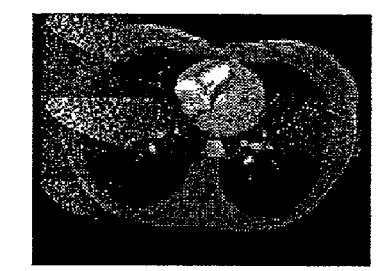
(noise)
FIG. 8A    FIG. 8B
Modified SENSE,
33% of lines (32 of
96), *in vivo* data
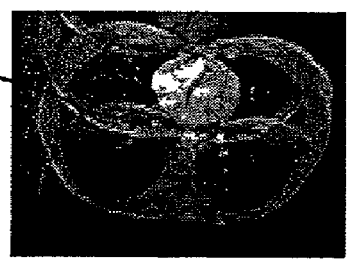
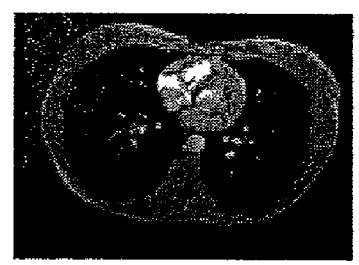
(artifact)
FIG. 9A    FIG. 9B

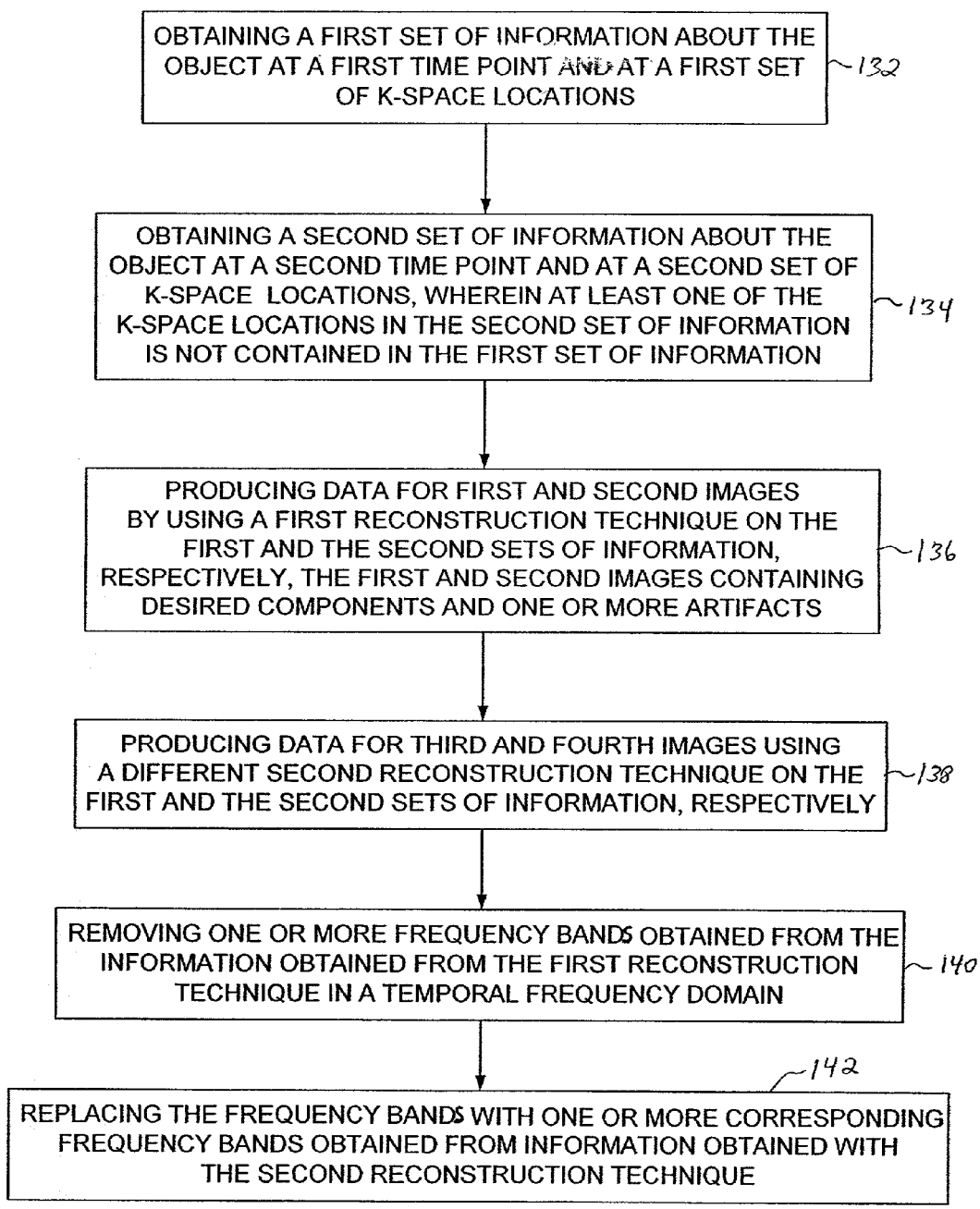

SENSE with matrix regularization, Systolic frame, 38% of lines (74 of 192) were acquired.
FIG. 12A
FIG. 12B
SENSE with matrix regularization, Mid-diastolic frame, 38% of lines (74 of 192) were acquired.
FIG. 13A
FIG. 13B

ARTIFACT SUPPRESSION IN DYNAMIC MAGNETIC RESONANCE IMAGING

This application claims the benefit of U.S. Provisional Application Ser. No. 60/285,422, filed Apr. 20, 2001.

FIELD OF THE INVENTION

The present application relates generally to suppressing and removing artifacts from magnetic resonance (MR) images.

BACKGROUND OF THE INVENTION

In many magnetic resonance imaging (MRI) applications, a given region of the body is imaged repeatedly to capture its time variations. For example, such dynamic applications include functional MRI (in which brain changes are induced by a time-varying paradigm), time-resolved angiography (in which changes in the blood vessels are caused by the passage of a bolus of contrast agent), and cardiac imaging (in which the heart changes as it beats, and also possibly as a bolus of contrast agent passes through it). The temporal resolution of the MRI, i.e. the time needed to acquire a time frame, should be good enough to capture the important features of the temporal changes. In the event that the readily available temporal resolution proves insufficient, there exist many dynamic MRI methods able to improve it. Some of these methods include UNFOLD, parallel imaging (e.g. SMASH, SENSE, SPACE-RIP) and partial-Fourier imaging techniques. The technique of UNFOLD is disclosed in U.S. Pat. No. 6,144,873, which is herein incorporated by reference. FIG. 1 shows a typical partial-Fourier imaging scanning technique (i.e. NEX<1 on a GE scanner) in which only one half of the k-space matrix is fully acquired and part of the other half is skipped. Through some assumption(s) and/or the use of prior information, these methods allow a fraction of the needed data to be calculated instead of measured. This reduction in the amount of acquired data usually translates directly into a corresponding reduction in the time needed to acquire the data and thus improves the temporal resolution, and/or the total scan time.

SUMMARY OF THE INVENTION

One embodiment of the invention includes a method for removing one or more leftover artifacts from a time series of dynamic magnetic resonance (MR) images. The method includes acquiring an MR data set by changing the k-space locations that are sampled at each time point; producing information for a first MR image at a first time point using a first magnetic resonance imaging (MRI) reconstruction technique on the MR data set; producing information for a second MR image at a second time point using the first MRI reconstruction technique on the data set, where both the first and second MR images contain desired components and one or more leftover artifacts; and separating the desired components from the one or more leftover artifacts in the first and second MR images by filtering the one or more leftover artifacts from the desired components in a temporal frequency domain.

Another embodiment of the invention includes a method for removing one or more leftover artifacts from a time series of dynamic MR images. The method includes obtaining a first set of information about the object at a first time point and at a first set of k-space locations; obtaining a second set of information about the object at a second time point and at a second set of k-space locations, wherein at least one of the k-space locations in the second set of information is not contained in the first set of information; producing data for first and second images by using a first reconstruction technique on the first and the second sets of information, respectively, the first and second images containing desired components and one or more artifacts; producing data for third and fourth images using a second reconstruction technique on the first and the second sets of information, respectively, wherein the second reconstruction technique is different than the first reconstruction technique; removing one or more frequency bands from the first and the second images in a temporal frequency domain; and replacing one or more of the frequency bands with corresponding frequency bands obtained from the third and the fourth images.

The methods of the invention can be accomplished through computer software that is embodied in article of manufacture.

An advantage of embodiments of the invention includes the removal or suppression of artifacts from MR images to produce an improvement in MR image quality.

BRIEF DESCRIPTION OF THE DRAWINGS

FIG. 1 is a diagram of a typical MRI acquisition technique in which partial-Fourier imaging is used to obtain a series of images over time;

FIG. 2 is a diagram of a modified MRI acquisition technique in which a modified partial-Fourier imaging approach is used to obtain a series of images over time;

FIGS. 3A and 3B are diagrams of modified MRI acquisition techniques in which modified SMASH or SENSE imaging is used to obtain a series of images over time;

FIGS. 4A-4C are graphs of amplitude vs. frequency for an image pixel that show the steps of one embodiment of the invention for removing one or more artifacts from MR images;

FIGS. 5A and 5B are graphs of amplitude vs. frequency for an image pixel that show the steps of another embodiment of the invention for removing one or more artifacts from MRI images;

FIGS. 6A and 6B are MR images, with and without artifact removal, respectively, reconstructed using the partial-Fourier imaging technique;

FIGS. 7A and 7B are MR images, with and without artifact removal, respectively, of simulated data reconstructed using the SMASH technique;

FIGS. 8A and 8B are MR images, with and without artifact removal, respectively, reconstructed using the SENSE technique;

FIGS. 9A and 9B are MR images, with and without artifact removal, respectively, reconstructed using the SENSE technique including matrix regularization;

FIG. 11 a flowchart for another embodiment of a method removing one or more artifacts from MR images;

FIGS. 12A and 12B are MR images, with and without artifact removal, respectively, reconstructed using the SENSE technique including matrix regularization;

FIGS. 13A and 13B are MR images, with and without artifact removal, respectively, reconstructed using the SENSE technique including matrix regularization.

DETAILED DESCRIPTION OF THE INVENTION

To label and remove artifacts in MRI, embodiments of the invention change the sampling function, i.e. the k-space locations that are sampled, from time frame to time frame. These changes bring extra information into the acquired data set, and such information can lead to a reduced level of artifacts in the MR images. Embodiments of the invention are used in conjunction with one or more MRI methods, such as partial-Fourier imaging, SMASH, SENSE, SPACE-RIP or variable-density imaging, and removes some or all of the artifacts leftover by these MRI method(s). Other embodiments are within the scope of the invention.

Rather than using an imaging technique that acquires the same k-space locations for every time frame as in FIG. 1, embodiments of the invention use an imaging technique that changes the acquired k-space from frame to frame as in FIGS. 2 and 3. Changing the sampling function as shown in FIGS. 2 and 3 does not affect the desired signal components, but it makes artifacts vary from time frame to time frame. These time variations of the artifacts effectively 'label' them, such that the artifacts can be subsequently identified and removed or replaced.

FIG. 1 shows four time frames 12a-12d of a typical partial Fourier imaging technique in which the acquired k-space locations 14 and the non-acquired k-space locations 16 do not change from frame to frame. FIG. 2, however, shows four frames 18a-18d of an exemplary modified partial Fourier imaging technique in which the acquired k-space locations change from 20 to 26 to 28 to 34 for frames 18a-18d, respectively. Similarly, as shown in FIGS. 3A and 3B, the k-space lines that are acquired in SMASH or SENSE imaging can be alternated from frame to frame. In frames 36a-36d of FIG. 3A, the acquired k-space lines change from 38 to 42 and the non-acquired k-space lines change from 40 to 44.

The techniques in which the acquired k-space is changed from frame to frame are not limited to the examples in FIGS. 2, 3A and 3B. For example, although the examples in FIGS. 2 and 3 show the even and odd frames having similar k-space acquisitions, the k-space acquisition patterns could repeat every three or more frames rather than two frames. Also, the number of frames acquired can vary significantly. Embodiments of the invention described herein can apply to acquisition techniques that have an acceleration rate higher than 2, such as SMASH or SENSE as depicted in FIG. 3B.

Figure 10:
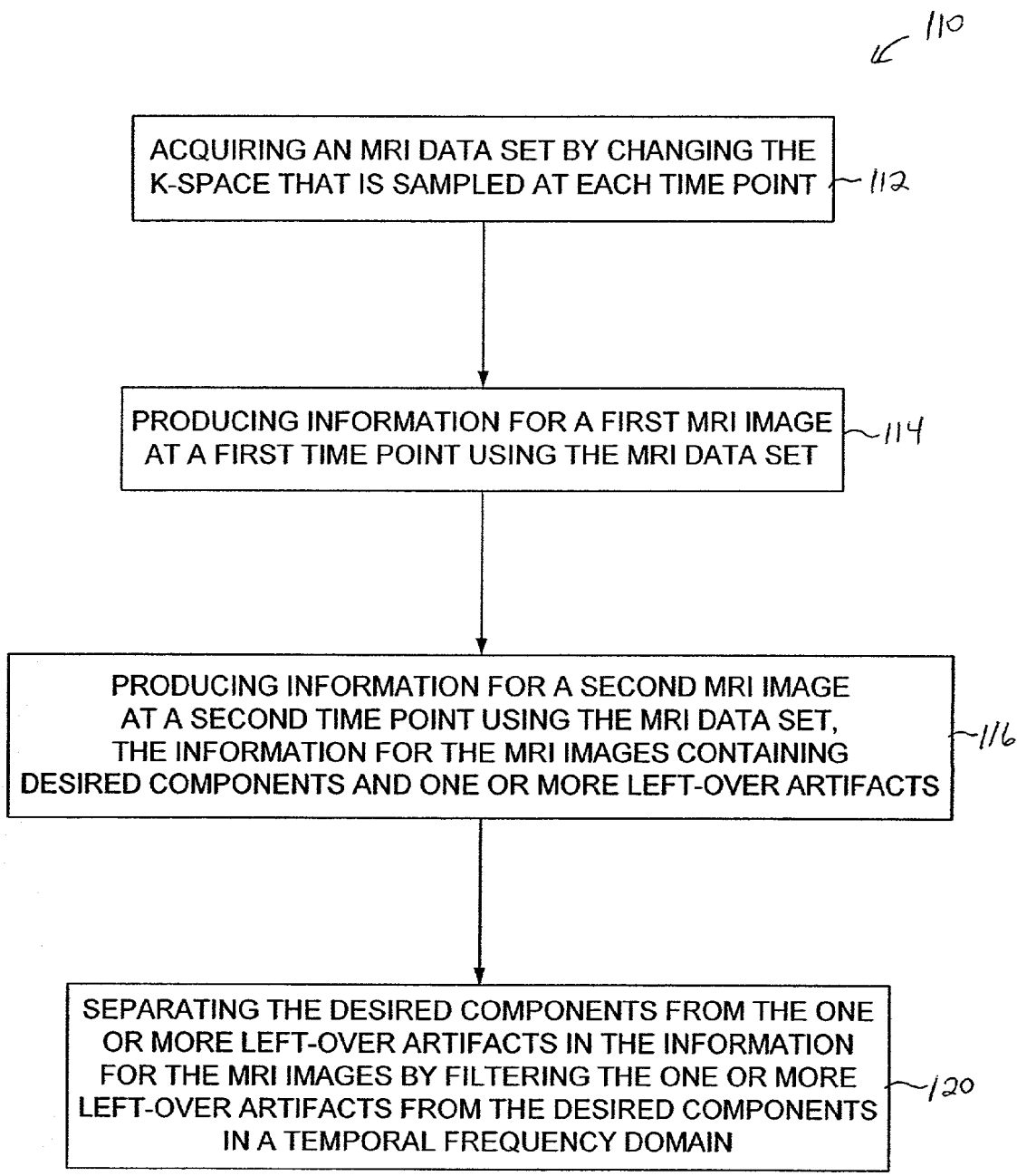
FIG. 10 is a flowchart for one embodiment of a method removing one or more artifacts from MR images.

Embodiments of the invention can be used to remove leftover artifacts. A "leftover artifact" is defined herein as an artifact left over by a reconstruction method such as partial-Fourier, SMASH or SENSE, for example. Typically, the reconstruction methods of SMASH, SENSE and partial-Fourier imaging are used to remove image artifacts that result from an incomplete acquisition of the k-space matrix. Because these dynamic reconstruction MRI methods do not work perfectly well, leftover artifacts can result from the reconstruction method. Embodiments of the invention are able to remove at least in part these leftover artifacts. Anytime the present method is used in combination with one or more methods to suppress artifacts, the present method is considered to act on a "leftover artifact" (regardless of whether the proposed steps are actually performed before or after the other method(s) in the actual processing). FIGS. 10 and 11 show embodiments of the present invention able to suppress or reduce these leftover artifacts.

Embodiments of the invention can use the temporal frequency domain to identify and filter artifacts from MR images, such as those obtained by partial-Fourier MR imaging. The temporal frequency domain can be obtained for a given image pixel in a time series of MR images by Fourier transforming the values of the image pixel as a function of time. FIGS. 4A-4C, 5A and 5B each show a spectrum in the temporal frequency domain.

In at least one embodiment of the invention, a given acquired data set is reconstructed (i.e. processed) in two different ways, leading to two reconstructed data sets such as the ones shown in FIGS. 4A and 4B. The two reconstructed data sets are combined into one data set 4C that is substantially free of artifacts. FIG. 4A shows a spectrum 50 having a desired component 48 that is superposed with smaller artifacts 51, 52 and 54 left over by a method such as partial Fourier, SMASH or SENSE for example. The artifacts 51 and 52 reside at or around the Nyquist (Ny) sampling frequency and the artifact 54 is centered at the direct current (DC) portion of the image. A sampling strategy such as the modified SMASH or SENSE (acceleration of 4) in FIG. 3B can produce the spectrum of FIG. 4A.

FIG. 4B shows a spectrum 60 having a desired component 62 centered at DC and artifacts 64 and 66 being around the Nyquist region but not at DC. The spectrum shown in FIG. 4B can be obtained from using the data from FIG. 3B and reconstructing it with a SMASH or SENSE algorithm with an acceleration factor of 2 instead of an acceleration factor of 4. Because one k-space line out of every four was acquired in FIG. 3B (and not one every 2), there is not enough k-space data for a factor of 2 reconstruction and large artifacts 64 and 66 ensue. However, because one line out of every two lines in FIG. 3B are sampled once in a while (once every two time frames), things that change slowly within the object can be reconstructed with an algorithm with an acceleration of 2, instead of a typically much less reliable algorithm with a factor of 4 acceleration. In other words, although there are large artifacts in FIG. 4B, the region near DC (i.e. signal that varies slowly in time) is mostly artifact-free.

FIG. 4C shows a spectrum 70 having a desired component 72 and substantially no artifacts. To obtain the substantially artifact free spectrum of FIG. 4C, the temporal frequency band 54 in FIG. 4A that is centered at DC is removed and replaced by the temporal frequency band 62 from FIG. 4B. Additionally, the temporal frequency bands 51 and 52 at the Nyquist frequency can be filtered out as shown. The desired components from FIGS. 4A and 4B are shown in the shaded regions 56, 58 and 68. The composite result, FIG. 4C, is substantially free of the artifacts seen in either FIG. 4A or 4B.

In at least another embodiment of the invention, a temporal frequency band around the Nyquist frequency is removed from a data set, such as the data set shown in FIG. 5A, to remove one or more artifacts from the data set. FIG. 5A shows a spectrum 80 having a desired component 82 centered at DC and artifacts 84 and 86 centered at the Nyquist frequency, away from DC. In imaging situations where the acceleration is higher than 2, or when a combination of methods (e.g. SENSE and partial-Fourier) is used, an artifact component is typically present at DC and an embodiment such as in FIG. 4 can be used. Otherwise, there should not be a DC artifact component and an embodiment such as FIG. 5 can be used. In these circumstances, the artifacts 84 and 86 can be suppressed by simply filtering out a small temporal frequency band around Nyquist, without also having to replace other temporal frequency bands, such as the temporal frequencies around DC.

The removal of the temporal frequency band centered at the Nyquist frequency can cause a small loss in temporal resolution and a corresponding increase in the signal-to-noise ratio (SNR). Keeping the frequency band narrow makes the negative effect on temporal resolution and the positive effect on SNR mostly negligible. Replacement with a corresponding artifact free temporal frequency band, such as the DC band, does not have any negative effect on temporal resolution nor SNR.

Converting SENSE's Noise into (Treatable) Artifacts

Noise amplification may represent a major problem in parallel imaging implementations. Parallel imaging preferably includes a strategy to keep noise amplification under control, such as limiting the size of the weights in SMASH fits, thresholding singular values in SPACE-RIP, or matrix regularization in SENSE. These approaches can effectively convert amplified noise into small amounts of artifacts. The present artifact suppression approach is able to treat artifacts that originate from converted amplified noise. Because amplified noise can be converted into artifacts, and that these artifacts can be suppressed with the present method, the method can, at least indirectly, treat noise amplification. Described below is a specific method for converting amplified noise into artifacts, which has been tested and found to work well with the present artifact suppression method.

An SNR-optimum way of combining images from many coils was presented by Roemer et al. more than a decade ago in their publication Romer et al., *The NMR Phased Array*, 16 MAGN RESON MED 192 (1990). The method disclosed by Roemer et al. does not expect aliased images as an input and hence does not correct for aliasing artifacts. While SENSE produces de-aliased images with potentially far-from-optimum noise properties at some spatial locations, the Roemer method applied to the same acquired data would generate optimum-SNR images corrupted by aliasing. The proposed algorithm finds a compromise between these two situations, and the artifacts that result are suppressed with the present method. By converting the noise amplification into artifacts that are suppressed, most of the noise amplification corrupting SENSE images can be removed.

Figure 14:
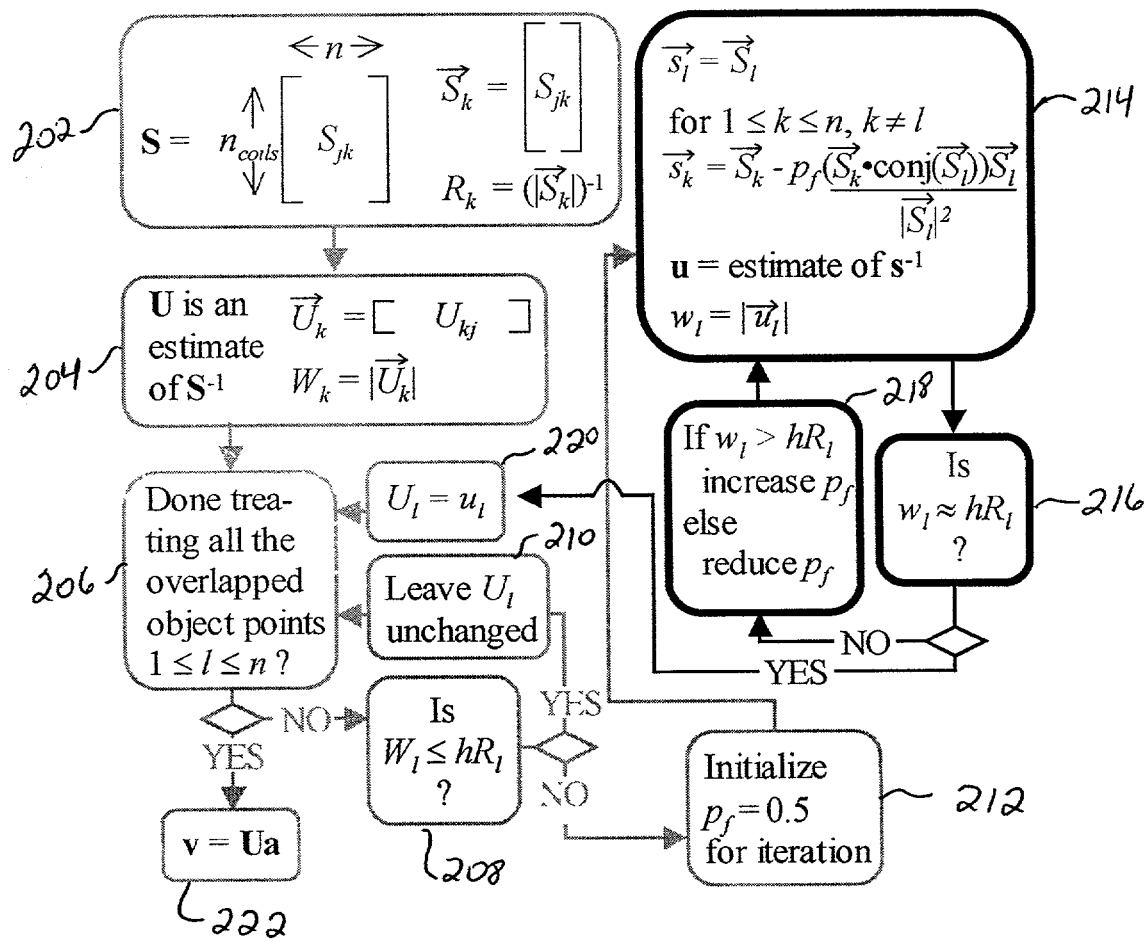
FIG. 14 is a flowchart for an embodiment of a method for matrix regularization.

FIG. 14 shows an exemplary method 200 for matrix regularization, which has been tested and shown to work well with the present artifact suppression method. The blocks 214, 216, 218 depicted with a thicker, black contour form an iterative loop at the core of the algorithm. The method starts at 202 with an $n_{coils}$ by n sensitivity matrix S, where n is the acceleration factor and $n_{coils}$ the number of coil elements. Assuming uncorrelated noise with a same standard deviation for all real and imaginary components of all coils, a noise level proportional to $R_k$ would be obtained at each one of the n reconstructed points (where $|S_1|$ is the length of the $l^{th}$ column vector of S, i.e. the root-sum-of-squares of all imaginary and real components from all coils in the vector). The values of $R_k$'s at 202 relate to an optimum-SNR scenario, where no attempt is made to correct aliasing artifacts.

At 204, the inverse of S is estimated, as required in the SENSE method. If SENSE were to be applied without matrix regularization, the row vectors of U would contain the weights to be given to each coil in the reconstruction of a given pixel. The values of $W_k$'s at 204 are proportional to the noise level that would be obtained, and relate to a scenario with suppression of aliasing artifacts but no attempt to limit noise amplification.

An upper limit for noise amplification is provided by the user; a value h=1.2 is used here, limiting the noise level to 20% above the optimum-SNR scenario obtained at 202. Each one of the n row vectors of U is analyzed separately. If a selected $1^{th}$ row vector readily leads to a noise level lower than the threshold, the row vector is left unchanged (i.e. the algorithm goes from 206 to 208 to 210 and back to 206, without modifying $U_l$). Otherwise, the algorithm goes from 206 to 208, to 212 where the iteration is initialized, and then to the iterative loop made of 214, 216 and 218. When a situation respecting the noise amplification limit is detected in 216, the iteration is stopped, $U_l$ is modified in 220 and the algorithm returns to 206. When all n rows of U have been treated, the algorithm ends at 222 with the usual SENSE relation between acquired data a and reconstructed data v. The algorithm is repeated for all groups of n pixels overlapped due to aliasing. A large user-input h corresponds to a SENSE reconstruction without matrix regularization, while h=1 is equivalent to a Roemer reconstruction (obtained when $p_f$ equal one at the end of the iterative loop, for all reconstructed pixels). Intermediate values of h correspond to hybrid reconstructions.

Experimental Results

FIGS. 6A-9B show results from embodiments of the invention used to remove artifacts from experimental MRI data. FIGS. 6A and 6B were obtained from phantom data acquired with a gradient-echo sequence, TR=9.8 ms, TE=3.8 ms, prospective gating was done using an ECG simulator, 50 ms temporal resolution, 16 time frames, and wherein the full k-space matrix was 256 by 256 points. FIGS. 7A and 7B were obtained from simulated data. FIGS. 8A, 8B, 9A and 9B were obtained from in vivo data acquired with a FastCard sequence having 2 views per segment, and TR=8.0 ms, prospective gating, and wherein the full k-space matrix was 96 by 256 points.

FIGS. 6A and 6B were obtained using partial-Fourier imaging. To obtain these images, a staple was taped onto an imaging phantom to create field inhomogeneities that challenge the partial-Fourier reconstruction algorithm. As a consequence, "ripple" artifacts were generated all over the reconstructed image 6A (first time frame of 16). These artifacts are removed by the present method, as shown in FIG. 6B.

FIGS. 7A and 7B show simulated data from a linear phased-array coil, the type required by original SMASH. An acceleration factor of 2 was simulated and the first time frame out of sixteen is shown here. Large artifacts 100 can be seen in the image of FIG. 7A. These artifacts are substantially erased as seen in FIG. 7B after removing the artifacts through an embodiment of the invention. For both the results in FIGS. 6 and 7, only Nyquist filtering and not DC replacement was performed, as the (non-corrupted) near-DC frequencies did not need to be replaced.

FIGS. 8A and 8B show results from using SENSE having an acceleration factor of 3 applied to a cardiac data set. The eighth time frame, out of twenty, is displayed here. As can be seen in FIG. 8A, obtaining a factor of 3 acceleration with our four-coil cardiac array is a challenging problem. There are bright artifacts caused by errors in the measured sensitivity maps and SENSE greatly amplifies the noise content 106 at certain locations in the reconstructed image. A comparison of FIGS. 8A and 8B demonstrates that the present method can remove artifacts, but not noise amplification. However, if the algorithm in FIG. 14 is used to convert most of the amplified noise into a small amount of extra artifacts as shown in FIG. 9A, embodiments of the present method can remove these artifacts along with artifacts of other origins to yield a mostly artifact-free result in FIG. 9B. No pixel in FIG. 9B was allowed more than a 20% increase in noise level compared to an SNR-optimum reconstruction, unlike FIGS. 8A or 8B in which noise amplification reached many folds at certain locations.

Another example, acquired with an acceleration factor of 2.6 using a modified True-FISP sequence, is presented in FIGS. 12A and B (systolic frame) and FIGS. 13A and B (mid-diastolic frame). The parameters were: 192 by 192 reconstructed matrix size, TE=1.7 ms, TR=4.3 ms, 4 views per segment (temporal resolution=4TR), 44 cardiac phases (real time points, without interpolation), scan time of 19 heart beats, 74 acquired k-space lines per frame (instead of 192), 25 cm FOV, double oblique plane (roughly a short axis plane). FIGS. 12B and 13B represent a real-acceleration equivalent of FIG. 9B (where acceleration was simulated by throwing away acquired data). The slightly lower acceleration (2.6 instead of 3) is due to self-calibration, as time is spent acquiring sensitivity-related data near k-space center. The online reconstruction of the MR images was fully automatic. Note that the images with UNFOLD artifact suppression in FIGS. 12B and 13B have improved image quality compared to those without in FIGS. 12A and 12B.

Flowcharts

FIG. 10 is a flowchart for one embodiment of a method 110 for removing one or more leftover artifacts from a plurality of dynamic magnetic resonance (MR) images. At 112, an MRI data set is acquired by changing the k-space that is sampled at each time point. A plurality of frames can be obtained using an MR imaging technique. At 114, information is produced for a first MR image at a first time point using the MRI data set. At 116, information is produced for a second MRI image at a second time point using the MRI data set. The information for the first MR image and the second MR image will contain desired components and one or more artifacts. At 120, the desired components are separated from the one or more leftover artifacts in the information for the first MR image and for the second MR image by filtering the one or more leftover artifacts from the desired components in a temporal frequency domain.

FIG. 11 is a flowchart for another embodiment of a method 130 for removing one or more artifacts from an MR image. At 132, a first set of information is obtained about the object at a first time point and at a first set of k-space locations. At 134, a second set of information is obtained about the object at a second time point and at a second set of k-space locations. At least one of the k-space locations in the second set of information is not contained in the first set of information. At 136, data is produced for first and second images by using a first reconstruction technique on the first and the second sets of information, respectively, the first and second images containing desired components and one or more artifacts. At 138, data is produced for third and fourth images using a second reconstruction technique on the first and the second sets of information, respectively, wherein the second reconstruction technique is different than the first reconstruction technique. At 140, one or more frequency bands are removed from the first and the second images in a temporal frequency domain. At 142, one or more of these frequency bands are replaced with corresponding frequency band(s) obtained from the third and the fourth images.

The methods of the invention can be accomplished through computer software. The software can be stored on computer usable medium for storing data, such as, for example, but not limited to, floppy disks, magnetic tape, zip disks, hard drives, CD-ROM, optical disks, or a combination of these.

Thus, by using embodiments of the invention, information can be gained by changing, from one MRI time frame to the next, the subset of k-space points being acquired. Embodiments of the invention allow this extra information to be manipulated to produce an improvement in MR image quality. Although the present application relates to conventional k-space, generalization to what is often called 'excitation k-space' is trivial and thus is within the scope of the invention. Furthermore, it should be understood that the order of the proposed steps may easily be changed; for example, one could perform the filtering operations on k-space data and then generate images, rather than generating images before performing the filtering operations. Such variations in the order of the operations are within the scope of the invention.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A method for removing one or more leftover artifacts from a time series of dynamic magnetic resonance (MR) images, the method comprising:
   acquiring an MR data set by changing k-space locations that are sampled at each time point;
   separating desired components from one or more leftover artifacts by filtering the one or more leftover artifacts from the desired components in a temporal frequency domain;
   producing information for a first MR image at a first time point using a first MR reconstruction technique; and
   producing information for a second MR image at a second time point using the first MR reconstruction technique.

2. The method of claim 1, wherein separating the desired components from the one or more leftover artifacts comprises:
   (a) Fourier-transforming an image or k-space pixel over time to obtain a result of a Fourier transform;
   (b) filtering the result of the Fourier transform to separate the desired components from the one or more leftover artifacts; and
   (c) repeating steps (a) and (b) above for a plurality of image or k-space pixels.

3. A method of claim 2, wherein filtering the result of the Fourier transform comprises removing a frequency band that is located around a Nyquist frequency.

4. A method of claim 1, wherein the MR data set has one or more artifacts centered at a DC frequency in the temporal frequency domain, the method further comprising:
   producing information for a third MR image at the first time point using a second MR reconstruction technique on the MR data set; and
   producing information for a fourth MR image at the second time point using the second MR reconstruction technique on the MR data set;
   wherein separating desired components from one or more leftover artifacts comprises:
   replacing a frequency band around the DC frequency in information treated with the first MR reconstruction technique with a corresponding frequency band from information treated with the second MR reconstruction technique.

5. The method of claim 1, wherein acquiring an MR data set by changing the k-space that is sampled at each time point comprises sampling a first set of k-space locations every odd frame and sampling a second set of k-space locations every even frame with a modified partial Fourier imaging technique.

6. The method of claim 1, wherein acquiring an MR data set by changing the k-space that is sampled at each time point comprises:

sampling a first set of k-space locations every odd frame; and sampling a second set of k-space locations every even frame.

7. The method of claim 1, wherein the MR reconstruction technique is SENSE.

8. The method of claim 1, wherein the MR reconstruction technique is SMASH.

9. The method of claim 1, further comprising converting noise amplification into an artifact such that the artifact can be reduced.

10. The method according to claim 1, where the filtering in a temporal frequency domain is performed after the MR reconstruction technique.

11. The method according to claim 1, where the MR reconstruction technique is a technique other than parallel imaging.

12. A method for removing one or more leftover artifacts from a time series of dynamic magnetic resonance (MR) images, the method comprising:

obtaining a first set of information about an object at a first time point and at a first set of k-space locations;

obtaining a second set of information about the object at a second time point and at a second set of k-space locations, wherein at least one of the k-space locations in the second set of information is not contained in the first set of information;

producing data for first and second images by using a first reconstruction technique on the first and the second sets of information, respectively;

producing data for third and fourth images using a second reconstruction technique on the first and the second sets of information, respectively, wherein the second reconstruction. technique is different than the first reconstruction technique;

removing one or more frequency bands from data treated with the first reconstruction technique, in a temporal frequency domain; and replacing one or more of the removed frequency bands with corresponding frequency bands obtained from data treated with the second reconstruction technique.

13. The method of claim 12, wherein removing one or more frequency bands comprises:

Fourier-transforming a time series of image or k-space pixels from the data treated with the first MR reconstruction technique; and filtering the result of the Fourier transform to remove frequency bands.

14. The method of claim 12, wherein removing a frequency band comprises removing in a temporal frequency domain a frequency band at a DC frequency in the data treated with the first MR reconstruction technique.

15. The method of claim 14, further comprising removing in a temporal frequency domain a frequency band near a Nyquist frequency in the data treated with the first MR reconstruction technique.

16. The method of claim 12, further comprising removing in a temporal frequency domain a frequency band near a Nyquist frequency in the data treated with the first MR reconstruction technique.

17. The method of claim 12, wherein the first reconstruction technique is a parallel imaging algorithm with a predetermined acceleration factor, and the second reconstruction technique is a parallel imaging algorithm with an acceleration factor twice smaller than the acceleration factor used in the first reconstruction technique.

18. The method of claim 12, further comprising converting noise amplification into an artifact such that the artifact can be reduced.

19. A method for removing one or more leftover artifacts from a plurality of dynamic magnetic resonance (MR) images, the method comprising:

obtaining a first set of information about the object at a first time point and at a first set of k-space locations;

obtaining a second set of information about the object at a second time point and at a second set of k-space locations, wherein at least one of the k-space locations in the second set of information is not contained in the first set of information;

producing a first set of image data at the first and second time points using a first MR reconstruction method on the first and the second sets of information, the first set of image data having at least one artifact centered at DC;

producing a second set of image data at the first and second time points using a second MR reconstruction method on the first and the second sets of information, the second set of image data being substantially artifact free at DC;

removing from the first set of image data a frequency band being centered at DC in the temporal frequency domain; and replacing the frequency band of the first set of image data with a corresponding frequency band centered at DC of the second set of image data.

20. The method of claim 19, further comprising removing from the first set of image data a second frequency band being centered near a Nyquist frequency in the temporal frequency domain.

21. An article of manufacture, comprising:

a computer usable medium having computer readable program code means embodied therein for removing one or more leftover artifacts from a time series of dynamic magnetic resonance (MR) images, the computer readable program code means in said article of manufacture comprising:

computer readable program code means for causing the computer system to acquire an MR data set by changing k-space locations that are sampled at each time point;

computer readable program code means for causing the computer system to separate desired components from one or more leftover artifacts by filtering the one or more leftover artifacts from the desired components in a temporal frequency domain;

computer readable program code means for causing the computer system to produce information for a first MR image at a first time point using a first MR reconstruction technique; and computer readable program code means for causing the computer system to produce information for a second MR image at a second time point using the first MR reconstruction technique.

22. The method according to claim 21, where the filtering in a temporal frequency domain is performed after the MR reconstruction technique.

23. The method according to claim 21, where the MR reconstruction technique is a technique other than parallel imaging.

24. An article of manufacture, comprising:
a computer usable medium having computer readable program code means embodied therein for removing one or more leftover artifacts from a time series of dynamic magnetic resonance (MR) images, the computer readable program code means in said article of manufacture comprising:
computer readable program code means for causing the computer system to obtain a first set of information about an object at a first time point and at a first set of k-space locations;
computer readable program code means for causing the computer system to obtain a second set of information about the object at a second time point and at a second set of k-space locations, wherein at least one of the k-space locations in the second set of information is not contained in the first set of information;
computer readable program code means for causing the computer system to produce data for first and second images by using a first reconstruction technique on the first and the second sets of information, respectively;
computer readable program code means for causing the computer system to produce data for third and fourth images using a second reconstruction technique on the first and the second sets of information, respectively, wherein the second reconstruction technique is different than the first reconstruction technique;
computer readable program code means for causing the computer system to remove one or more frequency bands from the data treated with first reconstruction technique, in a temporal frequency domain; and
computer readable program code means for causing the computer system to replace one or more of the removed frequency bands with corresponding frequency bands obtained from the data treated with the second reconstruction technique.

25. A method to accelerate the acquisition of a time series of MR images, the method comprising:
obtaining k-space information about an object at a first time and a first set of k-space locations;
obtaining k-space information about the object at a second time and a second set of k-space locations, wherein at least one of the k-space locations in the second set is different from the k-space locations in the first set;
transforming the k-space information at the first and second times to obtain spatial domain information at a first and second temporal frequency;
obtaining a first desired component at the first temporal frequency using first processing; and
obtaining a second desired component at the second temporal frequency using second processing that is different from the first processing.

26. The method according to claim 25, wherein using the first and second processing comprises applying knowledge regarding how desired and artifact components at the first temporal frequency differ from those at the second temporal frequency to tailor processing at each temporal frequency such that the first and second processing differ.

27. The method according to claim 26 wherein the first and second processing correspond to applying at least one MR method.

28. The method according to claim 27 wherein the at least one MR method includes at least one of parallel imaging and partial-Fourier imaging.

29. The method according to claim 27, wherein obtaining the desired component at the second temporal frequency differs from obtaining the desired component at the first temporal frequency by a setting chosen for the at least one MR method.

30. The method according to claim 29, wherein the setting is selected from the group consisting of acceleration factor, weight for a given MR method, and regularization parameters.

31. The method according to claim 25, wherein obtaining the desired component at the first and second temporal frequencies includes selecting a readily available signal without further processing.

32. The method according to claim 25, wherein the first and second temporal frequencies are usual Fourier frequencies, in a Fourier domain.

33. The method according to claim 25, wherein obtaining spatial domain information is done after obtaining desired components at the first and second temporal frequencies.

34. A method for removing one or more leftover artifacts from a time series of dynamic magnetic resonance (MR) images, the method comprising:
acquiring MR data by sampling k-space location sets that vary with time;
separating desired components from one or more leftover artifacts through temporal filtering;
producing information for a first MR image at a first time point using a first MR reconstruction technique; and
producing information for a second MR image at a second time point using the first MR reconstruction technique.

35. The method according to claim 34, where the temporal filtering is applied after the MR reconstruction technique.

36. The method according to claim 34, where the MR reconstruction technique is a technique other than parallel imaging.

37. A method for removing one or more leftover artifacts from a time series of dynamic magnetic resonance (MR) images, the method comprising:
obtaining a first set of information about an object at a first time point and at a first set of k-space locations;
obtaining a second set of information about the object at a second time point and at a second set of k-space locations, wherein at least one of the k-space locations in the second set of information is not contained in the first set of information;
producing a first intermediate result by applying a first temporal filtering to spatial information at the first and second time points;
producing a second intermediate result by applying a second temporal filtering to spatial information at the first and second time points, wherein the second temporal filtering is different from the first temporal filtering; and
combining the first and second intermediate results, to obtain a desired component at the first and second time points.

38. The method according to claim 37, wherein the spatial information includes a set of k-space locations.

39. The method according to claim 37, wherein the spatial information includes a set of object-domain locations.

* * * * *